US008702870B2

(12) United States Patent
Yi et al.

(10) Patent No.: US 8,702,870 B2
(45) Date of Patent: Apr. 22, 2014

(54) SUPERIMPOSITION OF RAPID PERIODIC AND EXTENSIVE POST MULTIPLE SUBSTRATE UV-OZONE CLEAN SEQUENCES FOR HIGH THROUGHPUT AND STABLE SUBSTRATE TO SUBSTRATE PERFORMANCE

(75) Inventors: Sang In Yi, San Jose, CA (US); Kelvin Chan, San Jose, CA (US); Thomas Nowak, Cupertino, CA (US); Alexandros T. Demos, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 75 days.

(21) Appl. No.: 12/987,948

(22) Filed: Jan. 10, 2011

(65) Prior Publication Data

US 2011/0100394 A1    May 5, 2011

Related U.S. Application Data (63) Continuation of application No. 12/178,523, filed on Jul. 23, 2008, now abandoned.

(60) Provisional application No. 61/076,537, filed on Jun. 27, 2008.

(51) Int. Cl.
*B08B 9/093* (2006.01)
(52) U.S. Cl.
USPC .............. 134/22.18; 134/1; 134/25.4; 134/26
(58) Field of Classification Search
CPC ............ B08B 7/0057; H01L 21/67028; H01L 21/67115; H01L 21/6719; H04M 1/00
See application file for complete search history.

(56) References Cited

U.S. PATENT DOCUMENTS

| 6,254,689 B1 | 7/2001 | Meder |
| 6,843,858 B2 | 1/2005 | Rossman |
| 7,265,061 B1 | 9/2007 | Cho et al. |

(Continued)

FOREIGN PATENT DOCUMENTS

| CN | 101171367 | 4/2008 |
| JP | 2005-210130 | 4/2005 |
| JP | 2008-075179 | 4/2008 |
| TW | 535222 | 6/2003 |

OTHER PUBLICATIONS

International Search Report and Written Opinion dated Nov. 19, 2009 for International Application No. PCT/US2009/046270.

(Continued)

*Primary Examiner* — Eric Golightly
(74) *Attorney, Agent, or Firm* — Patterson & Sheridan, LLP (57) ABSTRACT

A method for cleaning a substrate processing chamber, including processing a batch of substrates within a processing chamber defining one or more processing regions. Processing the batch of substrates may be executed in a sub-routine having various sub-steps including processing a substrate from the batch within the processing chamber, removing the substrate from the processing chamber, introducing ozone into the processing chamber, and exposing the chamber to ultraviolet light for less than one minute. The substrate batch processing sub-steps may be repeated until the last substrate in the batch is processed. After processing the last substrate in the batch, the method includes removing the last substrate from the processing chamber, introducing ozone into the processing chamber; and exposing the processing chamber to ultraviolet light for three to fifteen minutes.

18 Claims, 7 Drawing Sheets

(56) References Cited

U.S. PATENT DOCUMENTS

2006/0141806 A1 6/2006 Waldfried et al.
2006/0249175 A1 11/2006 Nowak et al.
2007/0134435 A1 6/2007 Ahn et al.
2010/0018548 A1 1/2010 Yi et al.

OTHER PUBLICATIONS

Notice of First Office Action dated Aug. 31, 2012 for Chinese Patent Application No. 20098015854.X.
Office Action dated Feb. 5, 2013 for Japanese Patent Application No. 2011-516399.
Office Action dated Sep. 9, 2013 for Chinese Patent Application No. 200980125854.X.

SUPERIMPOSITION OF RAPID PERIODIC AND EXTENSIVE POST MULTIPLE SUBSTRATE UV-OZONE CLEAN SEQUENCES FOR HIGH THROUGHPUT AND STABLE SUBSTRATE TO SUBSTRATE PERFORMANCE

CROSS REFERENCE TO RELATED APPLICATIONS

This application is a continuation of U.S. patent application Ser. No. 12/178,523, filed Jul. 23, 2008, now abandoned which claims benefit of U.S. Provisional Patent Application Ser. No. 61/076,537, filed Jun. 27, 2008, which are herein incorporated by reference.

BACKGROUND OF THE INVENTION

1. Field of the Invention

Embodiments of the invention generally relate to a method of cleaning a substrate processing chamber. More particularly, embodiments of the invention relate to methods of cleaning surfaces within an ultraviolet chamber for performing cure processes of dielectric films on substrates.

2. Description of the Related Art

Materials with low dielectric constants (low-k), such as silicon oxides ($SiO_x$), silicon carbide ($SiC_x$), and carbon doped silicon oxides ($SiOC_x$), find extremely widespread use in the fabrication of semiconductor devices. Using low-k materials as the inter-metal and/or inter-layer dielectric between conductive interconnects reduces the delay in signal propagation due to capacitive effects. The lower the dielectric constant of the dielectric layer, the lower the capacitance of the dielectric and the lower the RC delay of the integrated circuit (IC).

Low k dielectric materials are conventionally defined as those materials that have a dielectric constant k lower than that of silicon dioxide—that is k<4. Typical methods of obtaining low-k materials include doping silicon dioxide with various functional groups containing carbon or fluorine. While fluorinated silicate glass (FSG) generally has k of 3.5-3.9, carbon-doping methods can further lower the k value to approximately 2.5. Current efforts are focused on developing low-k dielectric materials, often referred to as ultra low-k (ULK) dielectrics, with k values less than 2.5 for the most advanced technology needs.

One approach for forming silicon containing films on a semiconductor substrate is through the process of chemical vapor deposition (CVD) within a chamber. Organosilicon supplying materials are often utilized during CVD of the silicon containing films. As a result of the carbon present in such a silicon supplying material, carbon containing films can be formed on the chamber walls as well as on the substrate.

Additionally, ultra low-k (ULK) dielectric materials may be obtained by incorporating air voids within a low-k dielectric matrix, creating a porous dielectric material. Methods of fabricating porous dielectrics typically involve forming a "precursor film" containing two components: a porogen (typically an organic material such as a hydrocarbon) and a structure former or dielectric material (e.g., a silicon containing material). Once the precursor film is formed on the substrate, the porogen component can be removed, leaving a structurally intact porous dielectric matrix or oxide network.

Techniques for removing porogens from the precursor film include, for example, a thermal process in which the substrate is heated to a temperature sufficient for the breakdown and vaporization of the organic porogen. One known thermal process for removing porogens from the precursor film includes a UV curing process to aid in the post treatment of CVD silicon oxide films. For example, U.S. Pat. Nos. 6,566,278 and 6,614,181, both to Applied Materials, Inc. and incorporated herein in their entirety, describe use of UV light for post treatment of CVD carbon-doped silicon oxide films.

However, after a UV curing process to remove porogen, the UV processing chamber can become coated with intact porogen, fragmented species of porogen, and other porogen residues, including coating of the windows that permit UV light to reach the substrate. With time, the porogen residue can reduce the effectiveness of the subsequent UV porogen removal processes by reducing the effective UV intensity available to the substrate and building up at the colder components of the chamber. Additionally, the build-up of porogen residue on the window is non-uniform resulting in film unevenly cured across the substrate. Furthermore, the build-up of excessive residues in the chamber can be a source of particulate defects on the substrate which is unsuitable for semiconductor processing. Accordingly, thermally unstable organic fragments of sacrificial materials (resulting from porogens used during CVD to increase porosity) need to be removed from the processing chamber.

Thus, methods and apparatus to adequately clean process chambers after an UV porogen removal process in a production environment are also needed. Therefore, there exists a need in the art for a UV chamber that can increase throughput, consume a minimum of energy and be adapted for in situ cleaning processes of surfaces within the chamber itself.

SUMMARY OF THE INVENTION

Embodiments of the present invention generally provide a method for cleaning a substrate processing chamber. In one embodiment, the method includes processing a batch of substrates within the processing chamber where processing the batch of substrates includes a series of steps. First, a substrate from the batch is processed within the processing chamber. Next, the substrate is removed from the processing chamber followed by introducing ozone into the processing chamber and exposing the processing chamber to ultraviolet light for less than one minute. The previous steps of processing a substrate in the batch, removing the substrate from the processing chamber, introducing ozone into the processing chamber, and exposing the chamber to ultraviolet light for less than one minute are repeated until the last substrate in the batch is processed. For substantially low out-gassing substrates, the less than one minute, rapid clean can be implemented periodically, post curing every second or every third substrate. After processing the last substrate in the batch, the last substrate is removed from the processing chamber. Next, ozone is again introduced into the processing chamber followed by exposing the processing chamber to ultraviolet light for three to fifteen minutes.

In another embodiment, the invention provides a substrate processing chamber that defines one or more processing regions and includes a controller comprising a computer readable medium. The computer readable medium contains instructions which, when executed, cause the substrate processing chamber to process a batch of substrates within the processing chamber. Processing the batch of substrates includes a series of steps. First, a substrate from the batch is processed within the processing chamber. Next, the substrate is removed from the processing chamber followed by introducing ozone into the processing chamber and exposing the processing chamber to ultraviolet light for less than one minute. The previous steps of processing a substrate in the batch, removing the substrate from the processing chamber, introducing ozone into the processing chamber, and exposing the chamber to ultraviolet light for less than one minute are repeated until the last substrate in the batch is processed. After processing the last substrate in the batch, the last substrate is removed from the processing chamber. Next, ozone is again introduced into the processing chamber followed by exposing the processing chamber to ultraviolet light for three to fifteen minutes.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention include methods of cleaning a substrate processing chamber with ultraviolet light and ozone to quality of substrates and significantly reduce chamber downtime while maintaining throughput. The process chamber walls, UV windows, and pedestal may be efficiently cleaned by removing residue build up, especially in the cold areas of the processing chamber which typically experience higher residue build up over time. Although any processing chamber may be cleaned using the invention, ultraviolet (UV) cure of porogens form residues that are thoroughly cleaned using embodiments of the invention.

In one embodiment of a processing chamber used for UV curing, a tandem processing chamber provides two separate and adjacent process regions in a chamber body and a lid having one or more bulb isolating windows aligned respectively above each process region. The bulb isolating windows may be implemented with one window per side of the tandem processing chamber to isolate one or more bulbs from the substrate in one large common volume, or with each bulb of an array of bulbs enclosed in a UV transparent envelope which is in direct contact with a processing region. One or more UV bulbs per process region may be covered by housings coupled to the lid and emit UV light that is directed through the windows onto each substrate located within each process region.

The UV bulbs can be an array of light emitting diodes or bulbs utilizing any of the state of the art UV illumination sources including, but not limited to, microwave arcs, radio frequency filament (capacitively coupled plasma) and inductively coupled plasma (ICP) lamps. Additionally, the UV light can be pulsed during a cure process. Various concepts for enhancing uniformity of substrate illumination include use of lamp arrays which can also be used to vary wavelength distribution of incident light, relative motion of the substrate and lamp head including rotation and periodic translation (sweeping), and real-time modification of lamp reflector shape and/or position.

Residues formed during the curing process may comprise carbon, e.g. both carbon and silicon, and are removed using an ozone based clean. Production of the necessary ozone may be done remotely with the ozone transported to the curing chamber, generated in-situ, or accomplished by running these two schemes simultaneously. Methods of generating the ozone remotely can be accomplished using any existing ozone generation technology including, but not limited to, dielectric barrier/corona discharge (e.g., Applied Materials' Ozonator) or UV-activated reactors. The UV bulbs used for curing the dielectric material and/or additional UV bulb(s) that can be remotely located may be used to generate the ozone.

Figure 1:
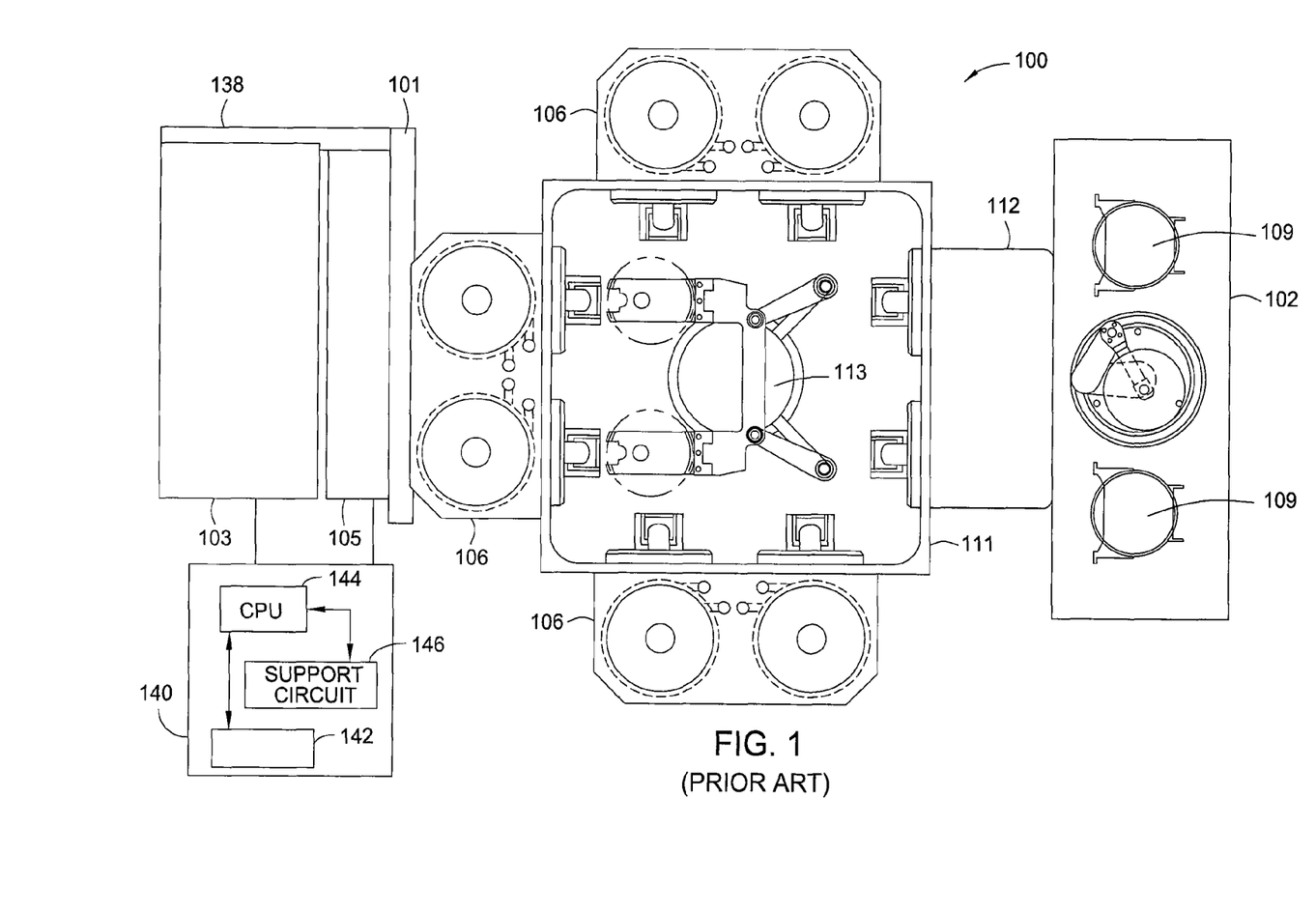
FIG. 1 is a plan view of a semiconductor processing system in which embodiments of the invention may be incorporated.

FIG. 1 shows a plan view of a semiconductor processing system 100 which may use embodiments of the invention. The system 100 illustrates one embodiment of a Producer™ processing system, commercially available from Applied Materials, Inc., of Santa Clara, Calif. The processing system 100 is a self-contained system having the necessary processing utilities supported on a mainframe structure 101. The processing system 100 generally includes a front end staging area 102 where substrate cassettes 109 are supported and substrates are loaded into and unloaded from a loadlock chamber 112, a transfer chamber 111 housing a substrate handler 113, a series of tandem processing chambers 106 mounted on the transfer chamber 111 and a back end 138 which houses the support utilities needed for operation of the system 100, such as a gas panel 103, and a power distribution panel 105.

Figure 3:
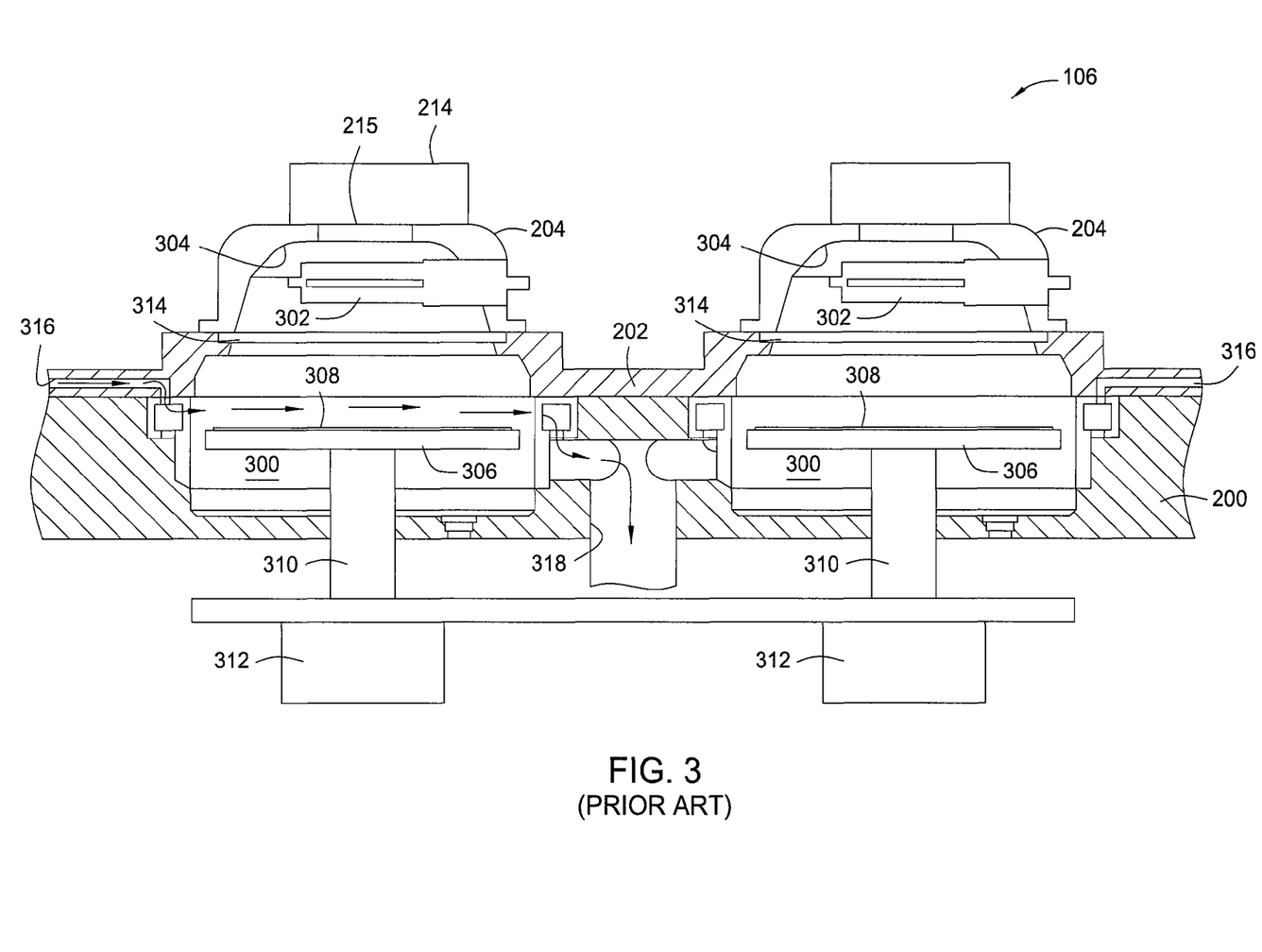
FIG. 3 is a partial section view of the tandem processing chamber that has a lid assembly with two UV bulbs disposed respectively above two process regions.

Each of the tandem processing chambers 106 includes two process regions for processing the substrates (see, FIG. 3). The two process regions share a common supply of gases, common pressure control, and common process gas exhaust/pumping system. Modular design of the system enables rapid conversion from any one configuration to any other. The arrangement and combination of chambers may be altered for purposes of performing specific process steps. Any of the tandem processing chambers 106 can include a lid according to aspects of the invention as described below that includes one or more ultraviolet (UV) lamps for use in a cure process of a low K material on the substrate and/or in a chamber clean process. In one embodiment, all three of the tandem processing chambers 106 have UV lamps and are configured as UV curing chambers to run in parallel for maximum throughput.

In an alternative embodiment where not all of the tandem processing chambers 106 are configured as UV curing chambers, the system 100 can be adapted with one or more of the tandem processing chambers having supporting chamber hardware known to accommodate various other known processes such as chemical vapor deposition (CVD), physical vapor deposition (PVD), etch, and the like. For example, the system 100 can be configured with one of the tandem processing chambers 106 as a CVD chamber for depositing materials, such as a low dielectric constant (K) film, on the substrates. Such a configuration can maximize research and development fabrication utilization and, if desired, eliminate exposure of as-deposited films to atmosphere.

A controller 140, including a central processing unit (CPU) 144, a memory 142, and support circuits 146, is coupled to the various components of the semiconductor processing system 100 to facilitate control of the processes of the present invention. The memory 142 can be any computer-readable medium, such as random access memory (RAM), read only memory (ROM), floppy disk, hard disk, or any other form of digital storage, local or remote to the semiconductor processing system 100 or CPU 144. The support circuits 146 are coupled to the CPU 144 for supporting the CPU in a conventional manner. These circuits include cache, power supplies, clock circuits, input/output circuitry and subsystems, and the like. A software routine or a series of program instructions stored in the memory 142, when executed by the CPU 144, causes the UV curing tandem processing chambers 106 to perform processes of the present invention.

Figure 2:
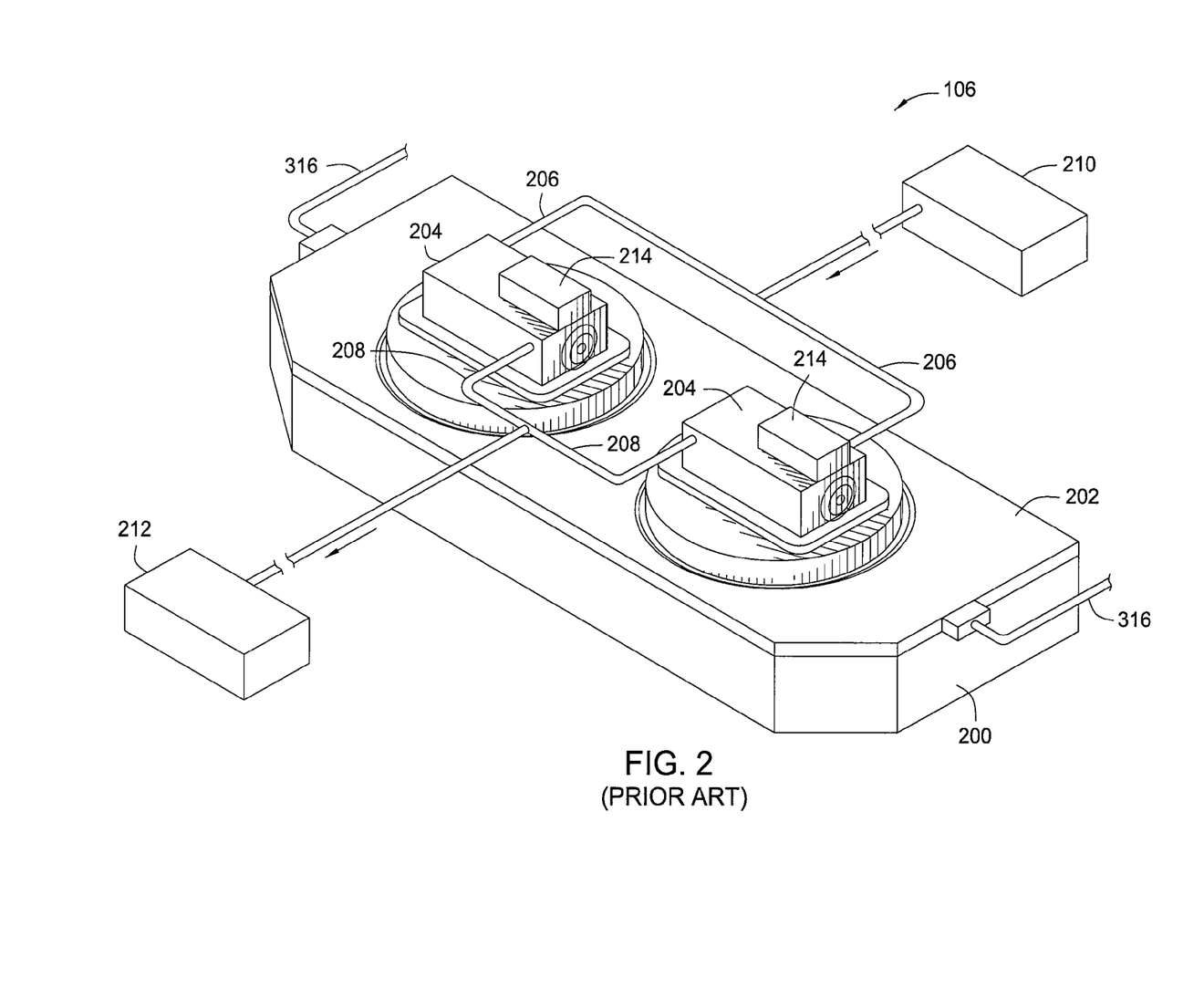
FIG. 2 is a view of a tandem processing chamber of the semiconductor processing system that is configured for UV curing.

FIG. 2 illustrates one of the tandem processing chambers 106 of the semiconductor processing system 100 that is configured for UV curing. The tandem processing chamber 106 includes a body 200 and a lid 202 that can be hinged to the body 200. Coupled to the lid 202 are two housings 204 that are each coupled to inlets 206 along with outlets 208 for passing cooling air through an interior of the housings 204. The cooling air can be at room temperature or approximately twenty-two degrees Celsius. A central pressurized air source 210 provides a sufficient flow rate of air to the inlets 206 to insure proper operation of any UV lamp bulbs and/or power sources 214 for the bulbs associated with the tandem processing chamber 106. The outlets 208 receive exhaust air from the housings 204, which is collected by a common exhaust system 212 that can include a scrubber to remove ozone potentially generated by the UV bulbs, depending on bulb selection. Ozone management issues can be avoided by cooling the lamps with oxygen-free cooling gas (e.g., nitrogen, argon or helium).

FIG. 3 shows a partial section view of the tandem processing chamber 106 with the lid 202, the housings 204 and the power sources 214. Each of the housings 204 cover a respective one of two UV lamp bulbs 302 disposed respectively above two process regions 300 defined within the body 200. Each of the process regions 300 includes a heating pedestal 306 for supporting a substrate 308 within the process regions 300. The pedestals 306 can be made from ceramic or metal such as aluminum. Preferably, the pedestals 306 couple to stems 310 that extend through a bottom of the body 200 and are operated by drive systems 312 to move the pedestals 306 in the process regions 300 toward and away from the UV lamp bulbs 302. The drive systems 312 can also rotate and/or translate the pedestals 306 during curing to further enhance uniformity of substrate illumination. Adjustable positioning of the pedestals 306 enables control of volatile cure by-product and purge and clean gas flow patterns and residence times in addition to potential fine tuning of incident UV irradiance levels on the substrate 308 depending on the nature of the light delivery system design considerations such as focal length.

In general, any UV source such as mercury microwave arc lamps, pulsed xenon flash lamps or high-efficiency UV light emitting diode arrays may be used. The UV lamp bulbs 302 are sealed plasma bulbs filled with one or more gases such as xenon (Xe) or mercury (Hg) for excitation by the power sources 214. Preferably, the power sources 214 are microwave generators that can include one or more magnetrons (not shown) and one or more transformers (not shown) to energize filaments of the magnetrons. In one embodiment having kilowatt microwave (MW) power sources, each of the housings 204 includes an aperture 215 adjacent the power sources 214 to receive up to about 6000 W of microwave power from the power sources 214 to subsequently generate up to about 100 W of UV light from each of the bulbs 302. In another embodiment, the UV lamp bulbs 302 can include an electrode or filament therein such that the power sources 214 represent circuitry and/or current supplies, such as direct current (DC) or pulsed DC, to the electrode.

For some embodiments, the power sources 214 can include radio frequency (RF) energy sources that are capable of excitation of the gases within the UV lamp bulbs 302. The configuration of the RF excitation in the bulb can be capacitive or inductive. An inductively coupled plasma (ICP) bulb can be used to efficiently increase bulb brilliancy by generation of denser plasma than with the capacitively coupled discharge. In addition, the ICP lamp eliminates degradation in UV output due to electrode degradation resulting in a longer-life bulb for enhanced system productivity. Benefits of the power sources 214 being RF energy sources include an increase in efficiency.

Preferably, the bulbs 302 emit light across a broad band of wavelengths from 170 nm to 400 nm. In one embodiment of the invention, the bulbs 302 emit light at wavelengths from 185 nm to 255 nm. The gases selected for use within the bulbs 302 can determine the wavelengths emitted. UV light emitted from the UV lamp bulbs 302 enters the process regions 300 by passing through windows 314 disposed in apertures in the lid 202. The windows 314 preferably are made of an OH free synthetic quartz glass and have sufficient thickness to maintain vacuum without cracking. Further, the windows 314 are preferably fused silica that transmits UV light down to approximately 150 nm. Since the lid 202 seals to the body 200 and the windows 314 are sealed to the lid 202, the process regions 300 provide volumes capable of maintaining pressures from approximately 1 Torr to approximately 650 Torr. Processing or cleaning gases enter the process regions 300 via a respective one of two inlet passages 316. The processing or cleaning gases then exit the process regions 300 via a common outlet port 318. Additionally, the cooling air supplied to the interior of the housings 204 circulates past the bulbs 302, but is isolated from the process regions 300 by the windows 314.

The housings 204 may include an interior parabolic surface defined by a cast quartz lining 304 coated with a dichroic film. The quartz linings 304 reflect UV light emitted from the UV lamp bulbs 302 and are shaped to suit the cure processes as well as the chamber clean processes based on the pattern of UV light directed by the quartz linings 304 into the process regions 300. The quartz linings 304 may adjust to better suit each process or task by moving and changing the shape of the interior parabolic surface. Additionally, the quartz linings 304 may transmit infrared light and reflect ultraviolet light emitted by the bulbs 302 due to the dichroic film. The dichroic film usually constitutes a periodic multilayer film composed of diverse dielectric materials having alternating high and low refractive index. Since the coating is non-metallic, microwave radiation from the power sources 214 that is downwardly incident on the backside of the cast quartz linings 304 does not significantly interact with, or get absorbed by, the modulated layers and is readily transmitted for ionizing the gas in the bulbs 302.

Figure 4:
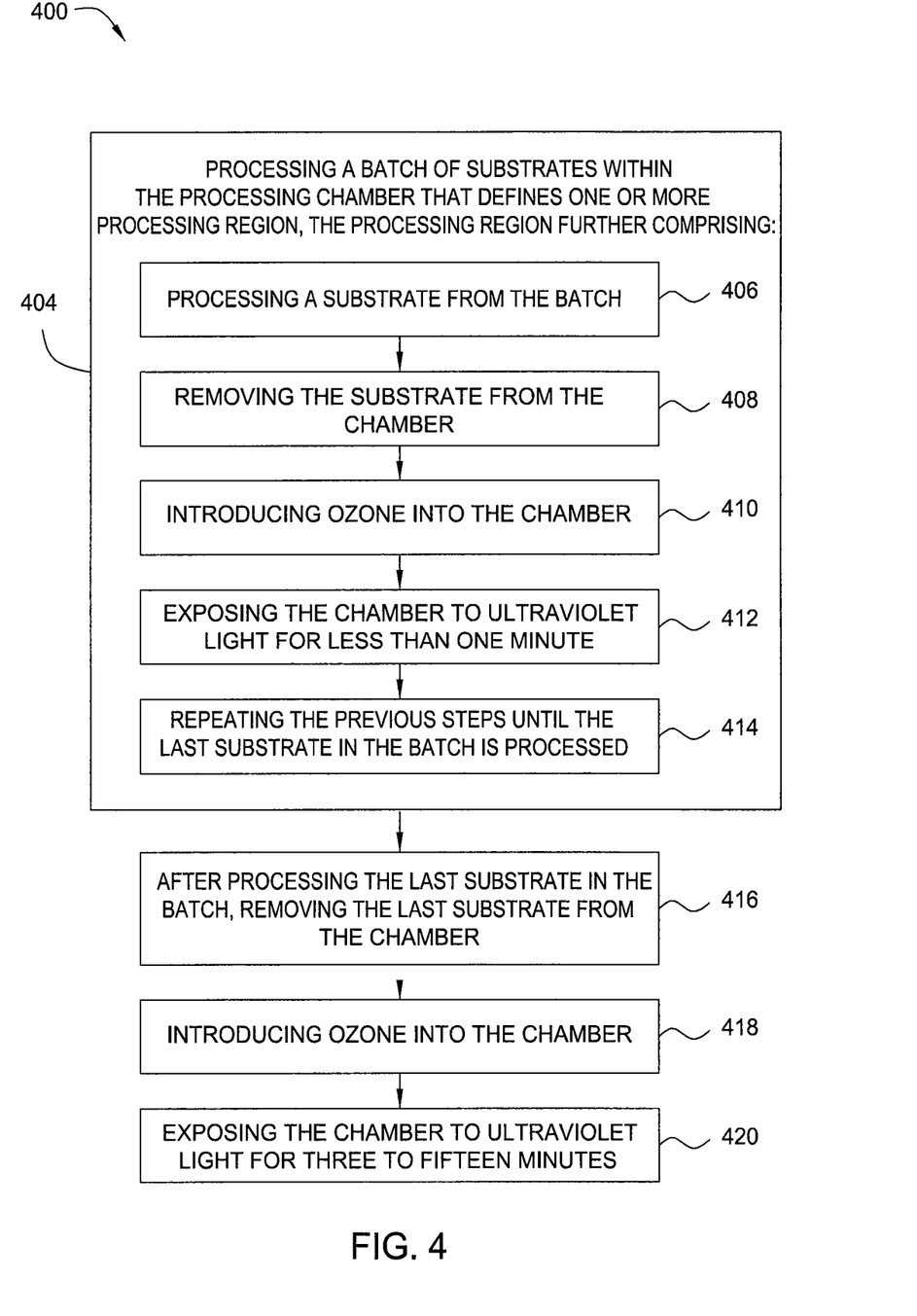
FIG. 4 is a process diagram of one embodiment of the invention.

Turning to FIG. 4, one embodiment of the invention is described. A method 400 for cleaning a substrate processing chamber, includes various steps and combinations to efficiently clean a substrate processing chamber while reducing chamber downtime and maintaining substrate throughput. The method 400 includes processing a batch of substrates within the processing chamber that defines one or more processing regions, box 404. Box 404 includes multiple sub-steps that may be performed as a repeating sub-loop in the overall cleaning process of method 400, depending on the number substrates processed within the processing chamber. Preferably, the batch of substrates includes 10-15 substrates, such as 13 substrates.

Processing a batch of substrates within the processing chamber, box 404, may be executed in a sub-routine having various sub-steps, including processing a substrate from the batch within the processing chamber, box 406, removing the substrate from the processing chamber, box 408, and initiating a discrete cleaning process comprising introducing ozone into the processing chamber, box 410, and exposing the chamber to ultraviolet light for less than one minute, box 412. The rapid clean, box 412, may be implemented for every second or every third substrate (2× and 3× repeat of box 406 to 408) when minimal UV window coating is present from curing of the substrates. The previous steps may be repeated until the last substrate in the batch is processed, box 414. For example if five substrates were processed, box 404, including the sub-loop boxes 406, 408, 410, and 412, may be repeated four times until the fifth and final substrate is processed. In one embodiment, processing the substrates includes removing porogen from a polymer previously deposited on the substrate.

After processing the last substrate in the batch, the last substrate is removed from the processing chamber, box 416. A batch cleaning process is initiated comprising introducing ozone into the processing chamber, box 418, and exposing the processing chamber to ultraviolet light for three to fifteen minutes, box 420. The ultraviolet light may include wavelengths between 185 nm and 255 nm. In box 412, the chamber may be exposed to ultraviolet light for 15 to 30 seconds in between the processing of each substrate. The ozone may be generated remotely from the processing region or introducing ozone into the chamber may include activating oxygen with ultraviolet light to create ozone.

Figure 5:
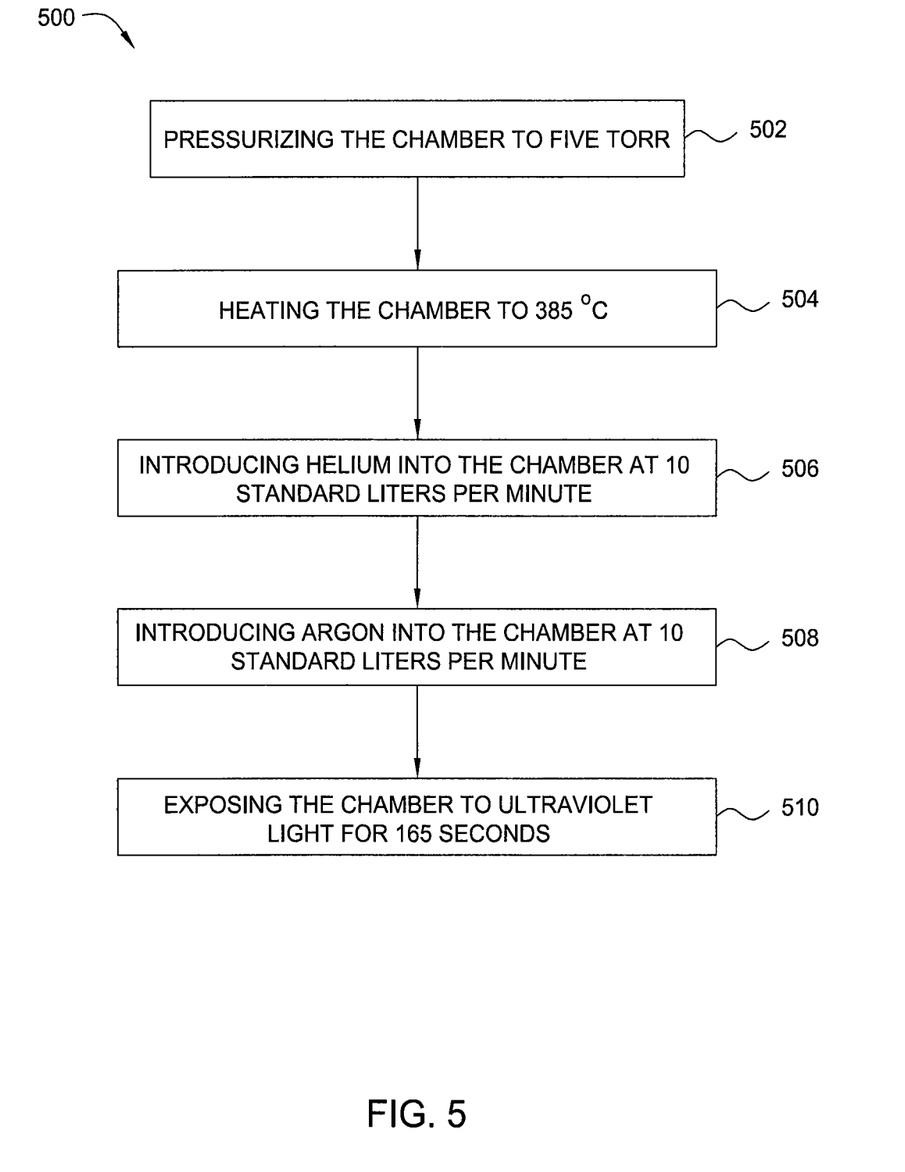
FIG. 5 is a process diagram of another embodiment of the invention.

FIG. 5 illustrates another embodiment of the invention. Processing the substrate, box 406 of method 400 for cleaning a substrate processing chamber, may further include a set of sub-steps 500. Processing the substrate may include pressurizing the chamber to five Torr, box 502, heating the chamber to 385° C., box 504, introducing helium into the chamber at 10 standard liters per minute, box 506, introducing argon into the chamber at 10 standard liters per minute, box 508, and exposing the chamber to ultraviolet light for 165 seconds, box 510.

Figure 6:
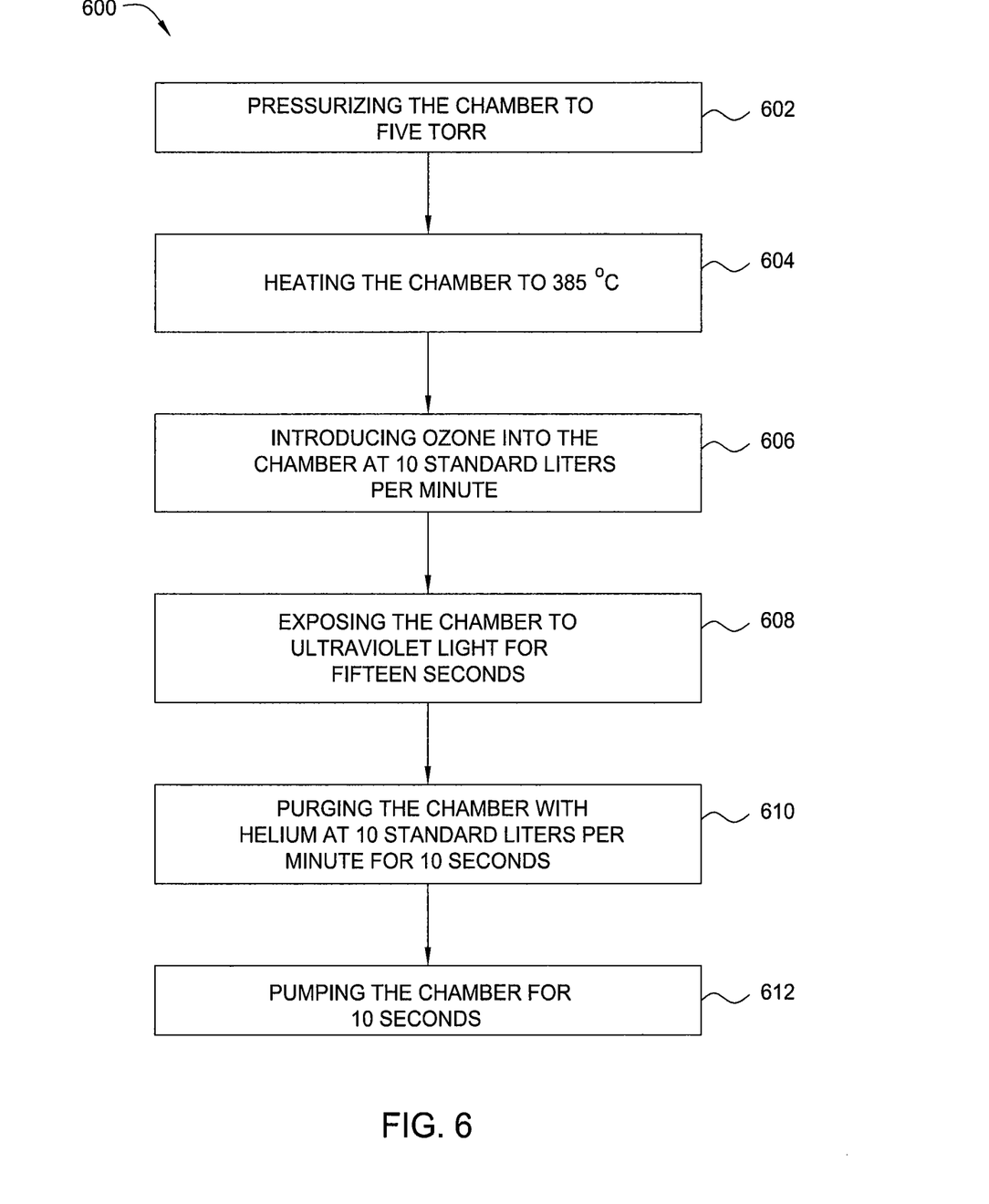
FIG. 6 is a process diagram of another embodiment of the invention.

FIG. 6 illustrates another embodiment of the invention. The discrete cleaning process between the processing of each substrate, comprising boxes 410 and 412, may further include a set of sub-steps 600. The cleaning process may include pressurizing the chamber to five Torr, box 602, heating the chamber to 385° C., box 604, introducing ozone into the chamber at 10 standard liters per minute, box 606, exposing the chamber to ultraviolet light for 15 seconds, box 608, purging the chamber with helium at 10 standard liters per minute for 10 seconds, box 610, and then pumping the chamber for 10 seconds, box 612.

Figure 7:
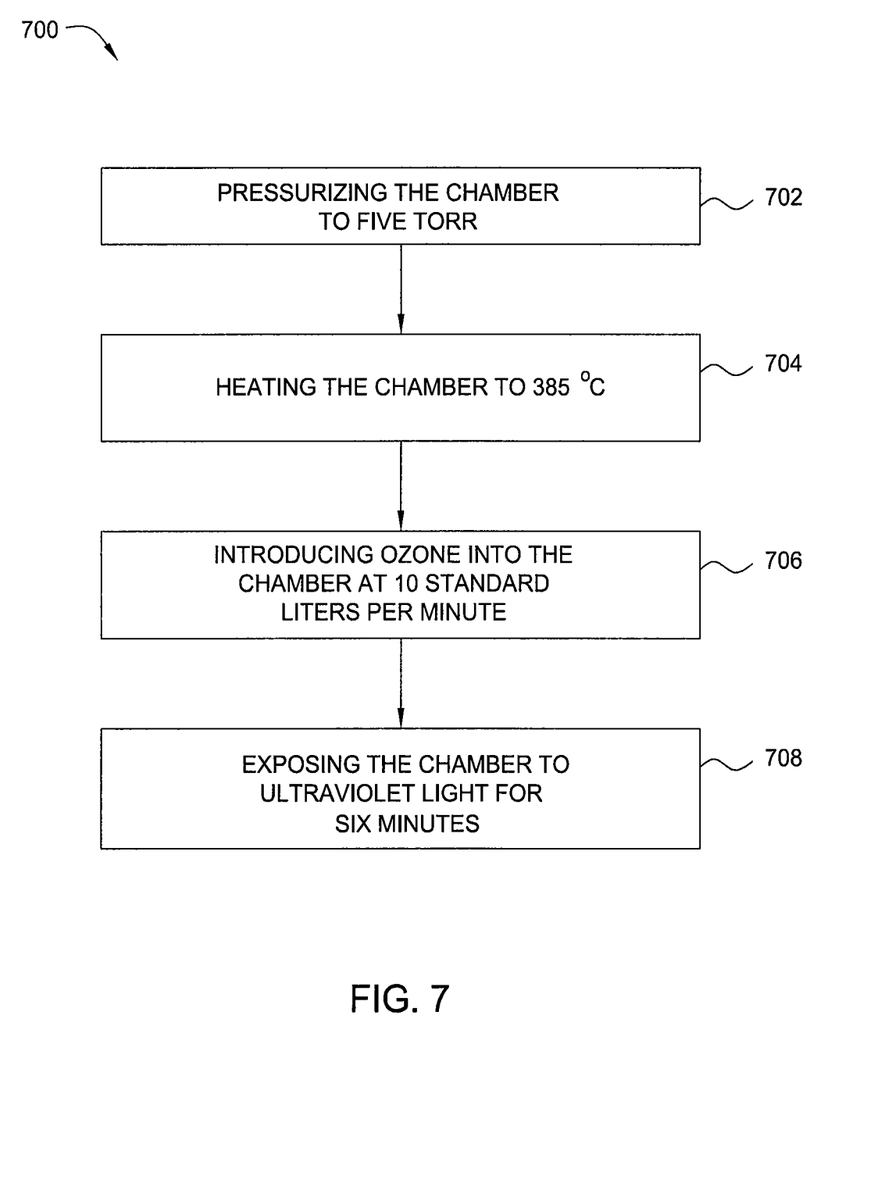
FIG. 7 is a process diagram of another embodiment of the invention.

FIG. 7 illustrates yet another embodiment of the invention. The batch cleaning process after processing the batch of substrates, comprising boxes 416, 418, and 420, may further include a set of sub-steps 700. The cleaning process may include pressurizing the chamber to five Torr, box 702, heating the chamber to 385° C., box 704, introducing ozone into the chamber at 10 standard liters per minute, box 706, and exposing the chamber to ultraviolet light for six minutes, box 708.

As shown in FIGS. 1-3, another embodiment of the invention includes a substrate processing chamber including an processing chamber 106 defining a processing region 300. A controller 140 comprising a computer readable medium, such as memory, 142 contains instructions which, when executed, cause the substrate processing chamber to process a batch of substrates within the ultraviolet curing tandem processing chambers 106. The process includes processing a substrate from the batch within the processing chamber, removing the substrate from the processing chamber, introducing ozone into the processing chamber, exposing the chamber to ultraviolet light for less than one minute, and repeating the previous steps until the last substrate in the batch is processed. The instructions further provide that after processing the last substrate in the batch, the last substrate is removed from the processing chamber, ozone is introduced into the processing chamber, and the processing chamber is exposed to ultraviolet light for three to fifteen minutes.

EXAMPLE 1

At Applied Materials, Inc, a ProducerSE PECVD chamber is used for deposition of Black Diamond II (BDIIx) dielectric film (k=2.5 for the 45 nm node) using a mixture of Si precursor such as methyldiethoxysilane (mDEOS) and porogen such as alpha-terpinine (ATRP). The film was deposited using the following parameters: an mDEOS flow rate of 1000 milligrams per minute (mgm), ATRP at 1000 mgm, and Helium as a carrier gas at 1000 standard cubic centimeters a minute. The film is deposited at a temperature of 300° C. at a pressure of five Torr and a RF power of 500 Watts.

The porogen is later removed using a ProducerSE UV chamber, to create a porous oxide network. Both intact form of the porogen and the fragmented species of porogen are removed from the SiC BDIIx matrix and upon exposure to UV at high temperatures (above 300° C.) The cure recipe includes exposing the chamber to ultraviolet light for 165 seconds while pressurizing the chamber to five Torr, heating the chamber to 385° C., and introducing into the chamber helium at 10 standard liters per minute and argon at 10 standards liters per minute.

After curing, the chamber is cleaned using a cleaning sub-routine executed in between each substrate processed (a 1× clean) and an extended cleaning step performed after 13 substrates (13× clean) according to embodiments of the present invention. The 1× clean includes 15 seconds of ultraviolet light exposure at 385° C. while pressurizing the chamber to five Torr and introducing ozone into the chamber at 10 standard liters per minute. The chamber is then purged with Helium at 10 standard liters per minute for 10 seconds followed and 10 seconds of pumping the chamber. The 13× clean includes six minutes of ultraviolet exposure at 385° C. while pressurizing the chamber to five Torr and introducing ozone into the chamber at 10 standard liters per minute. The chamber is then purged with Helium for 20 seconds and pumped for another 20 seconds.

In Table 1, the post deposition and post ultraviolet cure film thickness measurement results using KLA-TENCOR F5 Ellipsometry are shown, when cleaning the processing chamber according to embodiments of the present invention. Under typical UV chamber curing processes of substrates, the film shrinkage, which is defined as the decrease in film thickness divided by the initial thickness, may vary from substrate to substrate because of UV window particulate build up and cold area particulate build up. The shrinkage percent is linearly proportional to the extent of the UV exposure, and the shrinkage uniformity, which is defined as the one-sigma standard deviation of the shrinkage percentage, corresponds to the uniformity of the UV exposure predominantly among other variables. The KLA Tencor F5 Ellipsometry based shrinkage percent and shrinkage uniformity percent results shown are for a 32 substrate run.

As shown in Table 1, there is less than 0.3% change in shrinkage percentage for all substrates and the shrinkage uniformity percentage remains below 3.5% for all runs. Some degree of variability comes from the substrate to substrate differences in the chemical vapor deposition of the film which also affects the film shrinkage. Using embodiments of the invention, the UV window coating is virtually absent as evident from complete recovery of the shrinkage uniformity.

TABLE 1

| RUN | Thickness (Angstroms) | Standard Deviation Percent | Post UV Cure Thickness (Angstroms) | Standard Deviation Percent | Shrinkage Post UV Cure Shrinkage Percentage | Uniformity Percentage |
|---|---|---|---|---|---|---|
| Post Film Deposition | | | | | | |
| 1 | 2740 | 1.0 | 2394 | 1.0 | 12.6 | 2.9 |
| 5 | 2735 | 1.0 | 2392 | 0.9 | 12.6 | 2.6 |
| 6 | 2723 | 1.2 | 2376 | 1.1 | 12.7 | 3.0 |
| 10 | 2759 | 1.8 | 2411 | 1.6 | 12.6 | 3.3 |
| Six Minute Clean | | | | | | |
| 14 | 2746 | 1.2 | 2399 | 1.0 | 12.6 | 3.1 |
| 18 | 2735 | 1.1 | 2387 | 1.0 | 12.7 | 2.9 |
| 19 | 2815 | 1.1 | 2463 | 1.1 | 12.5 | 2.4 |
| 23 | 2735 | 0.9 | 2388 | 0.9 | 12.7 | 2.8 |
| 27 | 2719 | 0.9 | 2375 | 0.8 | 12.6 | 3.5 |
| 31 | 2746 | 1.1 | 2397 | 1.0 | 12.7 | 2.8 |
| 32 | 2727 | 1.6 | 2382 | 1.5 | 12.7 | 3.1 |

Embodiments of the present invention may help to remove intact and fragmented species of porogen and byproducts that coat the UV window and that build up in the colder areas of the chamber, such as the slit valve area of a processing chamber. The colder areas can especially be a source of residue which can contaminate substrates during processing. The coating of the UV window above the substrate in particular causes reduction in the effective UV intensity available to the substrate. Also because coating of the window is non-uniform, the film is cured unevenly across the substrate in the processing chamber.

To recover the UV intensity and uniformity, a rapid chamber clean may be executed after every substrate or semi periodically in every second or third substrate, according to embodiments of the invention. A longer ozone cleaning treatment may be used in between batches of substrates to remove the build up of residue at the chamber cold spots according to embodiments of the invention which helps minimize equipment downtime while maintaining substrate throughput. Thus, the present invention provides a fast every or semi periodic substrate clean for improved UV window recovery and an extensive multiple substrate clean for improved removal of residue sources thereby reducing particulate contamination of substrates. The fast clean in between each substrate is designed to be less than the chamber idle time during the substrate transfer and may result in zero throughput loss.

EXAMPLE 2

As in Example 1, the porogen is removed using a ProducerSE UV chamber, to create a porous oxide network. In this example, the UV cure and clean are carried out 50 Torr at increased flows, for conditions otherwise identical to Example 1. The cure recipe includes exposing the chamber to ultraviolet light for 165 seconds while pressurizing the chamber to 50 Torr, heating the chamber to 385° C., and introducing into the chamber helium at 30 standard liters per minute and argon at 30 standards liters per minute.

After curing, the chamber is cleaned using a cleaning subroutine executed in between each substrate processed (a 1× clean) and an extended cleaning step performed after 13 substrates (13× clean) according to embodiments of the present invention. The 1× clean includes 15 seconds of ultraviolet light exposure at 385° C. while pressurizing the chamber to 50 Torr and introducing ozone into the chamber at 30 standard liters per minute. The chamber is then purged with Helium at 10 standard liters per minute for 10 seconds followed and 10 seconds of pumping the chamber. The 13× clean includes six minutes of ultraviolet exposure at 385° C. while pressurizing the chamber to 50 Torr and introducing ozone into the chamber at 30 standard liters per minute. The chamber is then purged with Helium for 20 seconds and pumped for another 20 seconds.

EXAMPLE 3

As in Example 1, the porogen is removed using a ProducerSE UV chamber, to create a porous oxide network. In this example, the post dep film thickness is increased to 6K. To compensate for the greater porogen removal per substrate, the batch clean is carried out every sixth substrate. For post dep film thickness of 6K, the cure recipe includes exposing the chamber to ultraviolet light for 400 seconds while pressurizing the chamber to five Torr, heating the chamber to 385° C., and introducing into the chamber helium at 10 standard liters per minute and argon at 10 standards liters per minute.

After curing, the chamber is cleaned using a cleaning subroutine executed in between each substrate processed (a 1× clean) and an extended cleaning step performed after 13 substrates (13× clean) according to embodiments of the present invention. The 1× clean includes 15 seconds of ultraviolet light exposure at 385° C. while pressurizing the chamber to five Torr and introducing ozone into the chamber at 10 standard liters per minute. The chamber is then purged with Helium at 10 standard liters per minute for 10 seconds followed and 10 seconds of pumping the chamber. The 6× batch clean includes six minutes of ultraviolet exposure at 385° C. while pressurizing the chamber to five Torr and introducing ozone into the chamber at 10 standard liters per minute. The chamber is then purged with Helium for 20 seconds and pumped for another 20 seconds.

EXAMPLE 4

As in Example 1, the porogen is removed using a ProducerSE UV chamber, to create a porous oxide network. In this example, the post dep film thickness is reduced to 1.2K. Due to the smaller porogen removal per substrate, the batch clean is carried out every twenty-sixth substrate. For post dep film thickness of 1.2K, the cure recipe includes exposing the chamber to ultraviolet light for 100 seconds while pressurizing the chamber to five Torr, heating the chamber to 385° C., and introducing into the chamber helium at 10 standard liters per minute and argon at 10 standards liters per minute.

After curing, the chamber is cleaned using a cleaning subroutine executed in between each substrate processed (a 1× clean) and an extended cleaning step performed after 13 substrates (13× clean) according to embodiments of the present invention. The 1× clean includes 15 seconds of ultraviolet light exposure at 385° C. while pressurizing the chamber to five Torr and introducing ozone into the chamber at 10 standard liters per minute. The chamber is then purged with Helium at 10 standard liters per minute for 10 seconds followed and 10 seconds of pumping the chamber. The 26× batch clean includes six minutes of ultraviolet exposure at 385° C. while pressurizing the chamber to five Torr and introducing ozone into the chamber at 10 standard liters per minute. The chamber is then purged with Helium for 20 seconds and pumped for another 20 seconds.

EXAMPLE 5

As in Example 1, the porogen is removed using a ProducerSE UV chamber, to create a porous oxide network. In this example, the post dep film thickness is reduced to 1.2K. Due to the smaller porogen removal per substrate, the rapid every substrate clean is replaced by every second substrate clean. The batch clean cycle remains at 13×. For post dep film thickness of 1.2K, the cure recipe includes exposing the chamber to ultraviolet light for 100 seconds while pressurizing the chamber to five Torr, heating the chamber to 385° C., and introducing into the chamber helium at 10 standard liters per minute and argon at 10 standards liters per minute.

After curing of every two substrates, the chamber is cleaned and an extended cleaning step is performed after 13 substrates (13× clean) according to embodiments of the present invention. The every two substrate clean includes 15 seconds of ultraviolet light exposure at 385° C. while pressurizing the chamber to five Torr and introducing ozone into the chamber at 10 standard liters per minute. The chamber is then purged with Helium at 10 standard liters per minute for 10 seconds followed and 10 seconds of pumping the chamber. The 13× batch clean includes six minutes of ultraviolet exposure at 385° C. while pressurizing the chamber to five Torr and introducing ozone into the chamber at 10 standard liters per minute. The chamber is then purged with Helium for 20 seconds and pumped for another 20 seconds.

Any of the embodiments described herein can be combined or modified to incorporate aspects of the other embodiments. While the foregoing is directed to embodiments of the present invention, other and further embodiments of the invention may be devised without departing from the basic scope thereof, and the scope thereof is determined by the claims that follow.

What is claimed is:

1. A method of cleaning a processing chamber, comprising:
   (a) processing a substrate from a batch of substrates within the processing chamber to remove porogen from a dielectric material deposited on the substrate;
   (b) removing the substrate from the processing chamber;
   (c) performing a rapid chamber clean, comprising:
       pressurizing the processing chamber;
       heating the processing chamber;
       introducing ozone into the processing chamber; and
       exposing the processing chamber to ultraviolet light for about 15 seconds to about 30 seconds;
   (d) repeating (a) to (c) until the last substrate in the batch is finished with the processing in (a);
   (e) removing the last substrate from the processing chamber; and
   (f) after (d) and after the last substrate has been removed from the processing chamber, performing a batch chamber clean, comprising:
       pressurizing the processing chamber;
       heating the processing chamber;
       introducing ozone into the processing chamber; and
       exposing the processing chamber to ultraviolet light for about 3 minutes to about 15 minutes.

2. The method of claim 1, wherein the rapid chamber clean further comprises:
   prior to (d), purging the processing chamber with helium at about 10 standard liters per minute for about 10 seconds; and
   pumping the processing chamber for about 10 seconds.

3. The method of claim 1, wherein the ultraviolet light in (c) and (f) comprises wavelengths between 185 nm and 255 nm.

4. The method of claim 1, wherein the batch of substrates comprises about 10 to about 15 substrates.

5. The method of claim 1, wherein the ozone in steps (c) and (f) is generated remotely from the processing chamber.

6. A method of cleaning a processing chamber, comprising:
   (a) processing a substrate from a batch of substrates within the processing chamber to remove porogen from a dielectric material deposited on the substrate;
   (b) removing the substrate from the processing chamber;
   (c) performing a rapid chamber clean by exposing the processing chamber to ultraviolet light exposure for about 15 seconds to about 30 seconds while pressurizing the processing chamber and introducing ozone into the processing chamber;
   (d) repeating (a) to (c) until the last substrate in the batch is finished with the processing in (a);
   (e) removing the last substrate from the processing chamber; and
   (f) after (d) and after the last substrate has been removed from the processing chamber, performing a batch chamber clean by exposing the processing chamber to ultraviolet light exposure for about 3 minutes to about 15 minutes while pressuring the processing chamber and introducing ozone into the processing chamber.

7. The method of claim 6, wherein the ozone in (c) and (f) is introduced into the processing chamber at about 10 standard liters per minute.

8. The method of claim 6, wherein the (c) further comprises:
  purging the processing chamber with helium at about 10 standard liters per minute for about 10 seconds; and
  pumping the processing chamber for about 10 seconds.

9. The method of claim 6, wherein the ozone in (c) and (f) is generated remotely from the processing chamber.

10. The method of claim 6, wherein the batch of substrates comprises about 10 to about 15 substrates.

11. A method of cleaning a substrate processing chamber, comprising:
  (a) flowing a gas mixture of silicon-containing precursor and porogen into a first processing chamber;
  (b) depositing a low-k dielectric film on a substrate from a batch of substrates within the first chamber;
  (c) processing the substrate from the batch of substrates that have the low-k dielectric film deposited thereon to remove porogen from the low-k dielectric film deposited on the substrate within a second processing chamber;
  (d) removing the substrate from the second processing chamber;
  (e) performing a rapid chamber clean, comprising:
    pressurizing the second processing chamber to about 5 Torr;
    heating the second processing chamber to about 385° C.;
    introducing ozone into the second processing chamber at about 10 standard liters per minute; and
    exposing the second processing chamber to ultraviolet light for about 15 seconds to about 30 seconds;
  (f) repeating (a) to (e) until the batch of substrates is finished with the processing in (d); and
  (g) after (f) and after the last substrate in the batch has been removed from the second processing chamber, performing a batch chamber clean, comprising:
    pressurizing the second processing chamber to about 5 Torr;
    heating the second processing chamber to about 385° C.;
    introducing ozone into the second processing chamber at about 10 standard liters per minute; and
    exposing the second processing chamber to ultraviolet light for about 3 minutes to about 15 minutes.

12. The method of claim 11, wherein the silicon-containing precursor comprises methyldiethoxysilane and the porogen comprises alpha-terpinine.

13. The method of claim 11, wherein the batch of substrates comprises about 10 to about 15 substrates.

14. The method of claim 11, wherein the (e) further comprises:
  purging the second processing chamber with helium at about 10 standard liters per minute for about 10 seconds; and
  pumping the second processing chamber for about 10 seconds.

15. The method of claim 11, wherein the porogen is removed from the low-k dielectric film by exposing a substrate to ultraviolet light at a temperature of above about 300° C. for about 165 seconds while pressurizing the second processing chamber to about 5 Torr and heating the second processing chamber to about 385° C., and introducing helium into the second processing chamber at about 10 standard liters per minute.

16. The method of claim 15, further comprising:
  introducing argon into the second processing chamber at about 10 standard liters per minute.

17. The method of claim 1, wherein heating the processing chamber in (c) and (f) comprises heating the processing chamber to about 385° C.

18. The method of claim 6, wherein exposing the processing chamber to ultraviolet light exposure in (c) and (f) is performed at about 385° C.

* * * * *